United States Patent [19]
Shamouilian et al.

[11] Patent Number: 6,151,203
[45] Date of Patent: Nov. 21, 2000

[54] CONNECTORS FOR AN ELECTROSTATIC CHUCK AND COMBINATION THEREOF

[75] Inventors: Shamouil Shamouilian, San Jose; Ananda Kumar, Milpitas; Arnold Kholodenko, San Francisco, all of Calif.; Dennis S. Grimard, Ann Arbor, Mich.; Liang Guo Wang, San Jose, Calif.; Gerhard Schneider, Cupertino, Calif.; Michael G. Chafin, San Jose, Calif.; Semyon Kats, San Francisco, Calif.; Alexander Veytser, Mountainview, Calif.; Senh Thach, Union City, Calif.

[73] Assignee: Applied Materials, Inc., Santa Clara, Calif.

[21] Appl. No.: 09/212,000

[22] Filed: Dec. 14, 1998

[51] Int. Cl.[7] .................................................. H02N 13/00
[52] U.S. Cl. ............................................................ 361/234
[58] Field of Search ............................................. 361/234

[56] References Cited

U.S. PATENT DOCUMENTS 5,548,470  8/1996  Husain et al. ........................... 361/234
5,675,471  10/1997  Kotecki .................................... 361/234

FOREIGN PATENT DOCUMENTS

0831526 A2  3/1998  European Pat. Off. ........ H01L 21/68

*Primary Examiner*—Stephen W. Jackson
*Attorney, Agent, or Firm*—Thomason Moser Patterson

[57] ABSTRACT

A semiconductor wafer chuck for retaining a semiconductor wafer during semiconductor wafer processing in a semiconductor wafer processing system including a connector connecting DC chucking voltage and RF biasing power to an electrode embedded in the body of the chuck. The connector for the chuck includes two or more members joined by resilient banana connections. The connector may be adapted for use as a high temperature connector for an electrostatic chuck operated at an elevated temperature and such connector includes a thermal impedance for reducing the heat transferred from the chuck to the bottom of the connector.

20 Claims, 11 Drawing Sheets

CONNECTORS FOR AN ELECTROSTATIC CHUCK AND COMBINATION THEREOF

BACKGROUND OF THE INVENTION

1. Field of the Invention

This invention relates to electrostatic chucks for retaining a semiconductor wafer during semiconductor wafer processing in a semiconductor wafer processing system and, more specifically, to connectors for connecting DC chucking voltage and radio-frequency (RF) biasing power to an electrode embedded in a chuck.

2. Description of the Background Art

Numerous electrostatic chucks are known to the art for retaining a semiconductor wafer within a process chamber of a semiconductor wafer processing system. A semiconductor wafer processing system is disclosed in U.S. Pat. No. 4,842,683 entitled MAGNETIC FIELD-ENHANCED PLASMA ETCH REACTOR, David Cheng et al. inventors, patented Jun. 27, 1989, and assigned to the same assignee as the present invention; this patent is incorporated herein by reference as if fully reproduced herein. Further a typical prior art electrostatic chuck 10 is illustrated diagrammatically and separately in FIG. 1. Chuck 10 includes a chuck body 12 of ceramic material, such as for example aluminum nitride, and further includes an electrode 14 embedded in the chuck body 12, near the top portion thereof. The embedded electrode 14 may be, for example, a molybdenum mesh electrode. The electrode 14 is coupled to a power supply through a connector 16. The connector 16 includes a first male connector member 18 and a second female connector member 20. Chuck 10 is attached to a cooling plate 22 suitably mounted to the bottom of the chuck body 12 such as for example by a suitable adhesive or by suitable bol-s not shown. The cooling plate 22 may be made, for example, of stainless steel or aluminum and is provided with a plurality of cooling channels 21 for carrying a liquid coolant for cooling the chuck 10. The first connector member 18 includes an upper solid cylindrical portion 24 extending through a bore 25 formed in the chuck body 12 and an integrally formed lower solid cylindrical portion 26 extending through a bore 27 formed in the cooling plate 22; lower cylindrical portion 26 has a smaller diameter than the upper cylindrical portion 24. The second connector member 20 is provided with inwardly extending an upper cylindrical bore 28 forming a collet 29 for receiving the lower cylindrical portion 26 of the first connector member 18 to mechanically and electrically interconnect the first and second connector members 18 and 20. The second connector member 20 is fixed within an insulator portion 11 of a pedestal base (not shown). The bottom of the second connector member 20 is connected to a source of RF biasing power 30 and a source of DC chucking voltage 32 by a connector 34 and a conductor 35.

Referring to the top portion of FIG. 1, a body of suitable electrically conductive adhesive 36 mechanically and electrically interconnects the top of first connector member 18 and the electrode 14. The first connector member 18 is made of molybdenum and is suitably plated with an electrically conductive material such as gold, silver, nickel or copper for RF current conduction, and the second connector member 20 is made of beryllium copper and may be suitably plated with an electrically conductive material such as gold, silver or nickel for RF current conduction. Upon the lower cylindrical portion 26 of the first connector member 18 being inserted in the collet 29, DC chucking voltage is applied to the embedded electrode 14 to retain a semiconductor wafer on the chuck 10 during semiconductor wafer processing and RF biasing power is applied to the embedded electrode 14 to bias the retained semiconductor wafer.

Referring still to FIG. 1, it will be understood that the above-described male and female connector members 18, 20 of the connector 16 are made separately and are assembled in a blind assembly as indicated diagrammatically by the double headed vertical arrow 37. The lower cylindrical portion 26 of the first connector member 18 is referred to as a pin, and the bore 28 provided in the second connector member 20 is referred to as a collet and their interconnection is referred to as a pin and collet interconnection. Blind assembly of the pin and collet interconnection can result in angular misalignment between the pin and collet as indicated diagrammatically by the double headed horizontal arrow 38 in FIG. 1, and such angular misalignment is illustrated in solid outline and in exaggerated form in FIG. 1A. As shown in FIG. 1A, such angular misalignment can result, in extreme cases, in point or line contact rather than surface or area contact between the pin and collet. Such misalignment can result in unwanted electrical contact resistance leading to local RF heating and unwanted reduction in DC current for DC chucking voltage with an attendant loss in semiconductor wafer retention on the chuck 10. Further, the insertion of the pin into the collet can result in unwontedly high assembly and disassembly forces which can result in the misalignment forces being transferred to the interconnection between the top of the first connector member 18 and the embedded mesh electrode 14 causing mechanical and electrical failure of such interconnection. Similarly, unwantedly high disassembly forces which may be required to remove the pin from the collet and thus disassembly forces also can result in premature failure of the electrical and mechanical connection between the top of the first connector member 18 and the mesh electrode 14 provided by the adhesive 36.

Accordingly, there is a need in the art for a chuck having an improved connector for connecting RF biasing power and DC chucking voltage to an embedded chuck electrode and which improved connector includes at least two connector members which substantially avoid the above-noted connector member misalignment problem.

As is further known in the art, certain semiconductor wafer processing requires that the chuck be operated at a relatively elevated temperature, for example, about 200° C. to about 500° C. Thus, and referring again to FIG. 1, upon the chuck 10 being operated at about 200° C. to about 500° C. and upon the first and second connector members 18 and 20 being respectively molybdenum and beryllium copper, such molybdenum and beryllium copper connector members conduct the heat to which the chuck 10 is heated, e.g., about 200° C. to about 500° C., with little reduction in temperature, to the bottom of the second connector member 20. Upon the bottom of the second connector member 20 being at about 200° C. to about 500° C., with some reduction in temperature, the electrical connector 34 and the conductor 35 applying the RF and DC biasing voltage to the connector must be able to withstand substantially 200° C. to about 500° C., with some reduction in temperature, which greatly and undesirably increases their cost and which connector and conductor typically are not commercially available.

Accordingly, there is a further need in the semiconductor wafer chuck art for a chuck which is operated at a relatively high temperature in the range noted above and which chuck includes a connector for applying the DC chucking voltage and the RF biasing power to the chuck electrode which includes thermal impedance which at least assists in reducing the heat transferred between the top portion of the connector and the bottom portion of the connector such that a standard or commercially available electrical connector and electrical conductor can be connected to the bottom of the connector and used to apply the DC chucking voltage and the RF biasing power to the chuck electrode.

SUMMARY OF THE INVENTION

A semiconductor wafer chuck overcoming the disadvantages of the prior art and embodying the present invention includes a chuck body, an electrode embedded in the chuck body and a connector for connecting RF biasing power and/or DC chucking voltage to the embedded electrode. In one embodiment of the invention, the connector includes two connector members at least one of which is provided with a resilient banana connector for facilitating blind assembly of the connector members and in another embodiment the connector provides thermal impedance that at least assists in reducing the temperature at the bottom of the connector below the temperature at the top of the connector.

DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DESCRIPTION OF THE PREFERRED EMBODIMENTS

Figure 2:
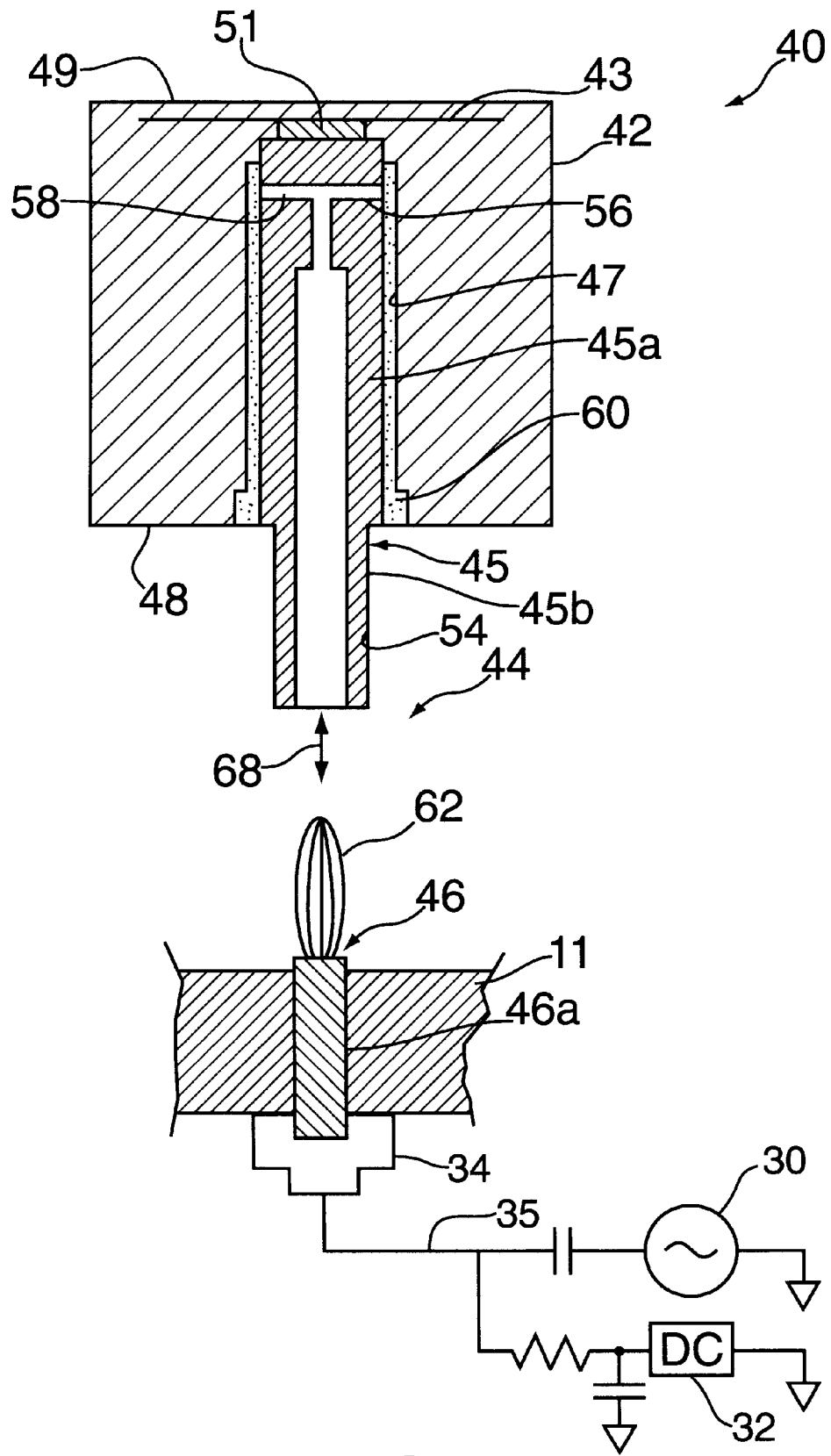
FIG. 2 is a vertical elevational view, generally in cross-section, of a first embodiment of a semiconductor wafer chuck and connector of the present invention.
Figure 2A:
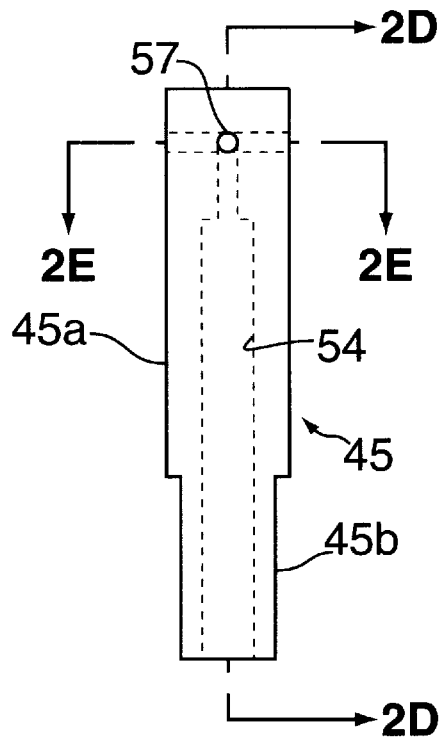
FIG. 2A is a vertical elevational view of a connector member comprising the chuck connector of the present invention.

FIG. 2 depicts a first embodiment of a semiconductor wafer electrostatic chuck 40 embodying the present invention. Chuck 40 includes a chuck body 42 in which an electrode 43 is embedded. The chuck body 42 may be made of a suitable ceramic material such as aluminum nitride, and electrode 43 may be a molybdenum mesh electrode. The chuck 40 further includes a connector 44 embodying the present invention and for connecting DC chucking voltage and/or RF biasing power to the electrode 43. Connector 44 includes a first generally cylindrical first connector member 45 and a second generally cylindrical second connector member 46. The first connector member 45 may be made of molybdenum and may be suitably plated with a suitable plating material chosen from a group consisting of gold, silver, nickel and copper for RF current conduction and the second connector member 46 may be made of beryllium copper and may be suitably plated with a suitable plating material chosen from the group consisting of gold, silver or nickel for RF current conduction. Alternatively, the RF current conduction plating material may be successive layers of nickel, copper, nickel and gold. The connector member 45 resides in a blind bore 47 formed generally centrally of the chuck body 42 and extending upwardly from the chuck bottom 48 toward the chuck top 49 and opening to the embedded electrode 43. The outer diameter of the upper enlarged cylindrical portion 45a of the generally cylindrical first connector member 45 and the diameter of the chuck bore 47 are dimensioned to form an annular air gap therebetween for receiving a suitable potting adhesive 60, of the type known to the art, for mechanically interconnecting the connector member 45 and the chuck body 42. The top of the connector element 45 is mechanically and electrically interconnected with the electrode 43 by a suitable body of electrically conductive adhesive 51 of the type known to the art for mechanically and electrically interconnecting metal parts.

Figure 2D:
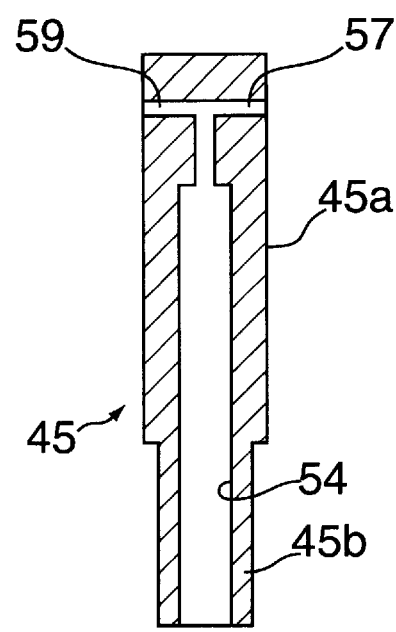
FIG. 2D is a vertical cross-sectional view taken generally along the vertical line D—D in FIG. 2A and in the direction of the arrows.
Figure 2B:
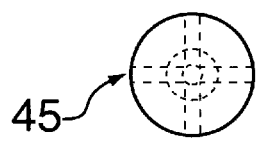
FIG. 2B is a top view of FIG. 2A.
Figure 2C:
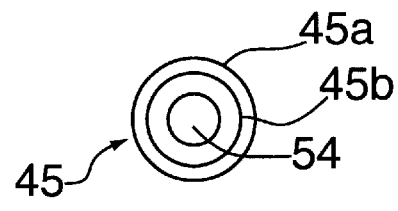
FIG. 2C is a bottom view of FIG. 2A.
Figure 2E:
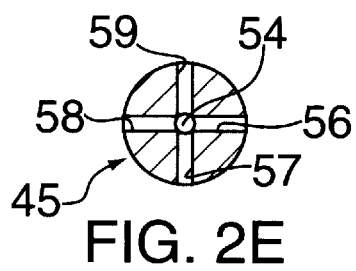
FIG. 2E is a horizontal cross-sectional view taken generally along the horizontal line E—E in FIG. 2A and in the direction of the arrows.
Figure 2F:
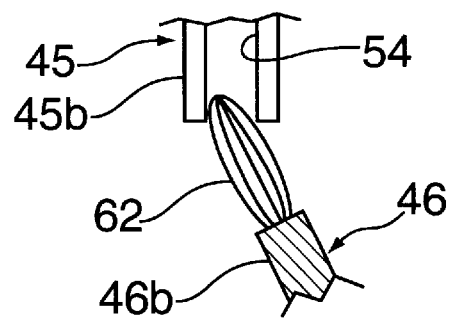
FIG. 2F is a partial diagrammatical view illustrating the advantages of a connector embodiment of the present invention including a resilient banana connector overcoming angular misalignment in blind assembly, and providing improved mechanical and electrical connection and reduced insertion and withdrawal forces.

The first connector member 45 is shown in detail in FIGS. 2A–2E and includes an upper cylindrical portion 45a and a lower cylindrical portion 45b of reduced diameter and is provided with a generally centrally formed bore 54 extending upwardly from the bottom of the upper cylindrical portion 45a toward the top thereof as shown in FIG. 2D. The upper cylindrical portion 45a of the first connector member 45 is provided with a plurality of horizontally and radially disposed vacuum bores 56–59 (note FIG. 2E) transverse or perpendicular to and in fluid communication with the central bore 54. Referring again to FIG. 2, a vacuum is drawn on the central bore 54 formed in the first connector member 45 and the vacuum is communicated to the transverse vacuum bores 56–59 to draw the potting adhesive 60, from a suitable source not shown, into the annular air gap between the upper cylindrical portion 45a of the first connector member 45 and the chuck body 42. Upon the potting adhesive 60 hardening, the first connector member 45 is firmly interconnected to the chuck body 42 and thus should any misalignment forces be produced during the blind assembly of the connector members 45 and 46 the transfer of any such misalignment forces to the interconnection provided by the body of electrically conductive adhesive 51 between the top of the connector member 45 and the embedded electrode 43 is greatly reduced.

As shown in FIG. 2, the second connector member 46 includes a cylindrical body 46a and a resilient banana connector, namely a male resilient banana jack 62, of the type known to the art, mounted suitably to the top of the cylindrical body 46a. The body 46a is generally fixed to an insulator portion 11 of a pedestal base (not shown). The male resilient banana jack 62 and the cylindrical body 46a in the preferred embodiment are made of beryllium copper and, for RF current conduction, are provided with a suitable plating of electrically conductive material such as a plating of electrically conductive material chosen from a group consisting of gold, silver or nickel; alternatively the RF current conduction plating material may be successive layers of nickel, copper, nickel and gold. A suitable electrical connector 34 may be connected to the bottom of the second connector member 46 and RF biasing power from a suitable source 30 and chucking voltage from a suitable DC source 32 may be connected to the connector 34 by a suitable electrical connector 35.

In a blind assembly, the male resilient banana jack 62 is inserted into the bore 54, which functions as a female banana jack socket for receiving the male resilient banana jack 62, to mechanically and electrically interconnect the first connector member 45 and the second connector member 46; since the bore 54 receives the male resilient banana jack 62, it may be considered to be a complementary resilient banana connector. Since the connector member 45 may be made of molybdenum as noted above, the bore 54 providing the female banana jack socket may be plated with a suitable electrically conductive material chosen from a group consisting of gold, silver, nickel and copper to enhance RF current conduction; alternatively the RF current conduction plating material may be successive layers of nickel, copper, nickel and gold. It has been found that the male resilient banana jack 62 and the female banana jack socket provided by the bore 54 require much lower insertion and withdrawal forces, as indicated by the double-headed vertical arrow 68 in FIG. 2, than do the pin and collet connection of the first and second connector members 18 and 20 illustrated in FIG. 1 and described above. Further, the male resilient banana jack 62, FIG. 2, accommodates any angular misalignment between the male resilient banana jack 62 and the female banana jack socket provided by the bore 54 upon the blind assembly of the first connector member 45 and the second connector member 46. Still further, it has been found that the geometry or configuration of the male resilient banana jack 62 produces substantially consistent mechanical and electrical area or surface contact between the male resilient banana jack 62 and the female banana jack socket provided by the bore 54 upon any angular misalignment therebetween. It will be understood that the term "resilient banana connector" as used herein and in the appended claims is used to mean either a male resilient banana connector or a female resilient banana connector and that the term "complementary resilien banana connector" is used to mean a female banana jack socket upon the "resilient banana connector" being a male resilient banana connector and is used to mean a male connector member upon the "resilient banana connector" being a female resilient banana connector.

Figure 3:
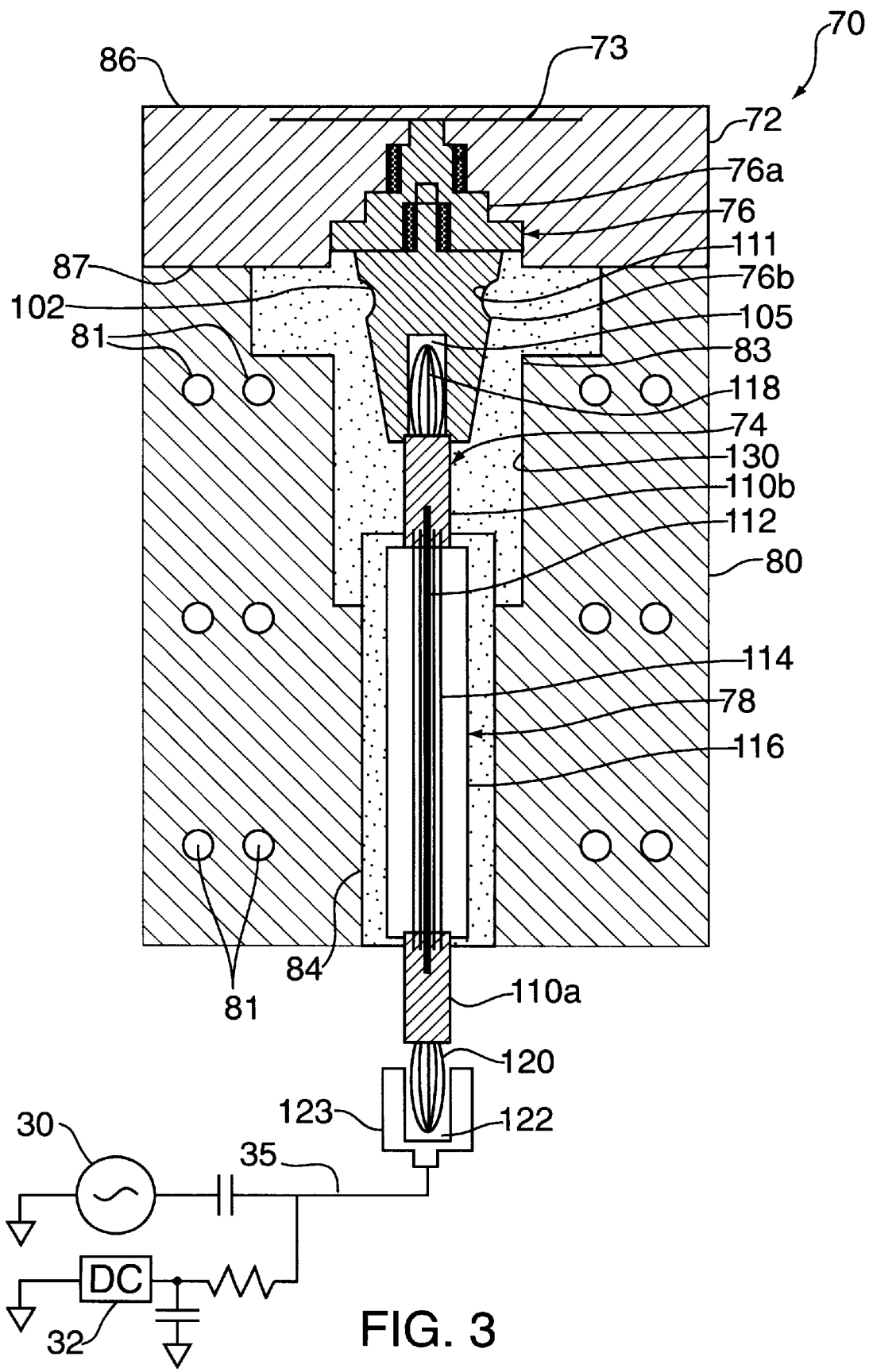
FIG. 3 is a vertical elevational view, generally in cross-section, of an alternate embodiment of a semiconductor wafer chuck and connector of the present invention.

An alternate embodiment of a semiconductor wafer chuck 70 embodying the present invention is shown in FIG. 3. Chuck 70 includes a chuck body 72 which in the preferred embodiment is ceramic, in particular aluminum nitride. An electrode 73 is embedded in the chuck body 72 and in the preferred embodiment the embedded electrode is a molybdenum mesh electrode. Chuck 70 further includes a connector 74 embodying the present invention and for connecting RF biasing power and DC chucking voltage to the embedded electrode 73. Connector 74 includes a first connector member 76 and a second connector member 78. First connector member 76 includes a first molybdenum connector element 76a (better seen in FIGS. 3B–D) and a second stainless steel connector element 76b (better seen in FIG. 3E); for RF current conduction the elements 76a and 76b are provided with a suitable plating of electrically conductive material such as a plating of electrically conductive material chosen from a group consisting of gold, silver, nickel and copper; alternatively the RF current conduction plating material may be successive layers of nickel, copper, nickel and gold. The chuck 70, as shown in FIG. 3, further includes an aluminum cooling plate 80 mounted to the chuck body 72, for example, by suitable bolts or by a suitable adhesive (not shown). The cooling plate 80 is provided with a plurality of cooling channels 81 for receiving a suitable coolant for cooling the chuck 70. In addition, and referring still to FIG. 3, chuck 70 further includes a first resilient insulator 83 and a second resilient insulator 84; in the preferred embodiment, the resilient insulators are made of silicone.

Figure 3A:
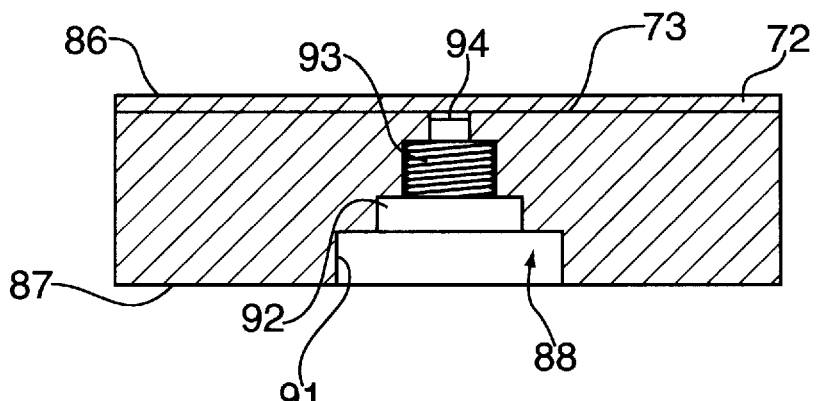
FIG. 3A is a vertical cross-sectional view of the chuck body shown in FIG. 3.
Figure 3B:
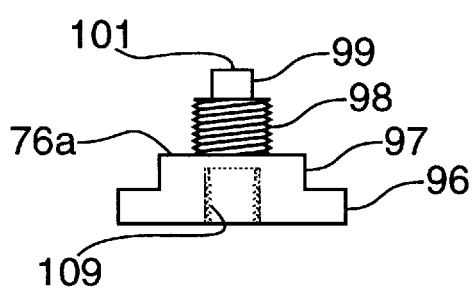
FIG. 3B is a side elevational view of a first connector element shown in FIG. 3.
Figure 3C:
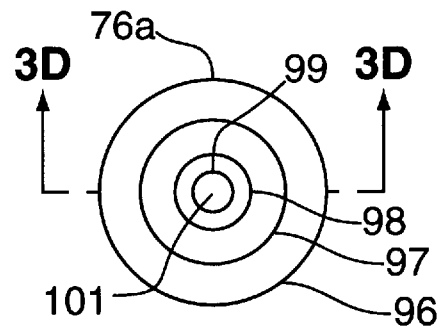
FIG. 3C is a top view of FIG. 3B.
Figure 3D:
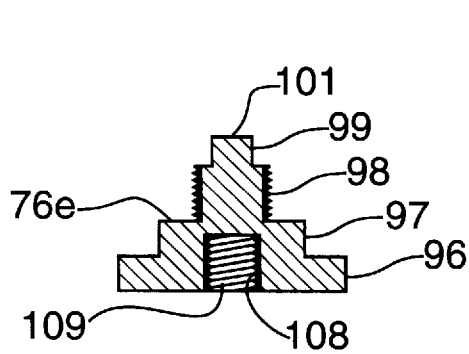
FIG. 3D is a vertical cross-sectional view taken generally along the line D—D in FIG. 3C and in the direction of the arrows.

As shown in FIG. 3A, the chuck body 72 has a top 86 and a bottom 87 and is provided with a generally centrally formed stepped blind bore 88 and which bore extends upwardly from the chuck body bottom 87 toward the top 86 and opens to the electrode 73. The stepped bore 88 includes a plurality of cylindrical portions 91–94 decreasing in diameter successively upwardly as shown in FIG. 3A. The first molybdenum connector element 76a, FIGS. 3B–3D, is a stepped connector element and includes a plurality of generally cylindrical portions 96, 97, 98 and 99 which decrease in diameter successively upwardly as shown in FIGS. 3B and 3D; first connector element 76a also includes a top 101. The cylindrical portions provided on the first connector element 76a are complementary in size and shape to the cylindrical portions 91–94 of the stepped bore 88, FIG. 3A, and are for being received therein as will be understood from FIG. 3. As will be noted particularly from FIG. 3A, the cylindrical portion 93 of the stepped bore 88 is provided with internal threads and the stepped portion 98 of the first connector element 76a, FIG. 3B, is provided with external threads. The first molybdenum connector element 76a is connected mechanically to the chuck body 72 as shown in FIG. 3 by the threaded engagement between the external threads (FIG. 3B) provided on the first connector element 76a and the internal threads provided in the stepped bore 88 (FIG. 3A). It will be further understood that in the preferred embodiment the top 101 of the first connector element 76a (FIGS. 3B–3D) is connected mechanically and electrically to the embedded electrode 73 (FIG. 3) by being brazed thereto; to prevent air gaps between the first connector element 76a and the chuck body 72, the cylindrical portions provided on the first connector element 76a may be brazed to the chuck body. The first connector element 76a is provided with a suitable plating of electrically conductive material chosen from a group consisting of gold, silver, nickel, and copper for RF current conduction; alternatively the RF current conduction plating material may be successive layers of nickel, copper, nickel and gold.

Figure 3E:
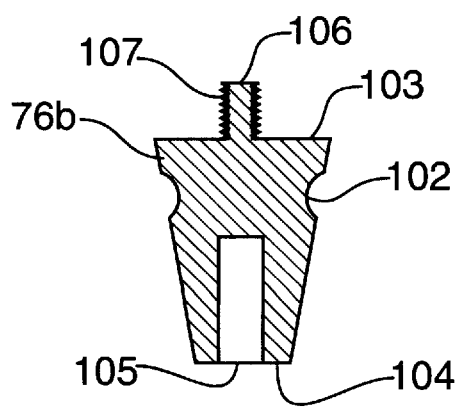
FIG. 3E is a vertical elevational view, in cross-section, of a second connector element shown in FIG. 3.

Referring to FIG. 3E, the second connector element 76b has a top end 103 and a bottom end 104 and is generally frusto-conical in shape decreasing in diameter downwardly from said top end to the bottom end. In the preferred embodiment, the second stainless steel connector element 76b is provided with a generally centrally formed blind bore 105 extending upwardly from its bottom end 104 toward the top end 103; the bore 105 provides a female banana jack socket as shown in FIG. 3 and is considered to be a complementary resilient banana connector. Extending upwardly from the top end 103 of the second connector element 76b (FIG. 3E) is an integrally formed, upwardly extending cylindrical member 106 which is provided with external threads 107 for threadedly engaging the internal threads 108 (FIG. 3D) provided in the bore 109 extending upwardly generally centrally of the first connector element 76a. Such threaded engagement mechanically and electrically interconnects the first connector element 76a and the second connector element 76b as shown in FIG. 3.

Figure 3F:
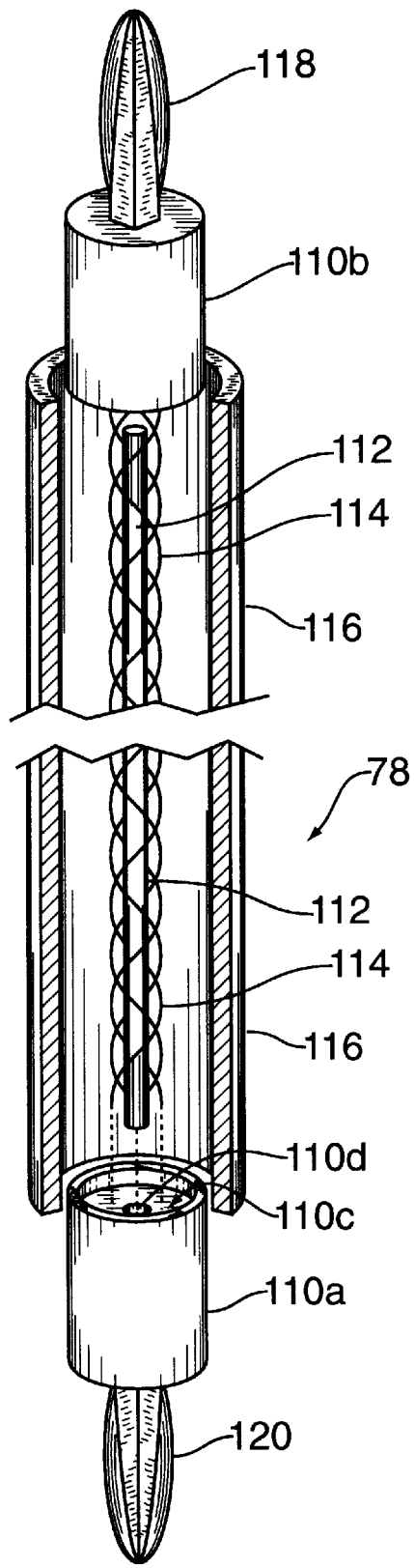
FIG. 3F is a diagrammatical illustration of a connector member included in a connector embodying the present invention and shown in FIG. 3.

The second connector member 78, FIG. 3, is a composite comprised of first and second electrically conductive connector elements 110a and 110b which may be made of stainless steel. The structure of the second connector member 78 is better seen in FIG. 3F and includes a longitudinally extending solid central core 112 which in the preferred embodiment is a length of resilient stainless steel or spring steel and is primarily for providing the second connector member 78 with flexibility and rigidity to enhance the blind assembly of the second connector member 78 with the first connector member 76 particularly the second connector element 76b. Further, FIG. 3F, the second connector member 78 includes a plurality of longitudinally extending stranded electrical conductors 114 and which in the preferred embodiment comprises a plurality of tightly wound stranded copper conductors wrapped around the central core 112. Representative conductive connector element 110a is provided with an inwardly extending blind bore 110c and a second blind bore 110d extending inwardly of said first blind bore; it will be understood that electrically conductive element 110b is similarly configured with such blind bores. The bottom ends of the plurality of longitudinally extended stranded electrical conductors 114 are received in the blind bore 110c and the bottom end of the solid central core 112 is received in the blind bore 110d after which the bottom ends of the stranded electrical conductors 114 and the solid central core 112 are connected to the conductive connector element 110a by brazing; the top ends of the stranded electrical conductors 114 and the solid central core 112 are connected to the conductive connector element 110b in the same manner. Additionally, the second connector member 78 includes a pliable conductive wrap 116 surrounding the plurality of stranded copper electrical conductors 114; the pliable conductive wrap 116 is for eliminating any air gaps between the plurality of stranded copper electrical conductors 114. As will be noted from FIG. 3, the first connector element 110b is provided with a resilient banana connector, namely a male resilient banana jack 118 and the second connector element 110a is provided with a male resilient banana jack 120. The top male resilient banana jack 118 is for being inserted into the bore 105 (best seen in FIG. 3E) formed in the first connector element 76a which bore 105, as noted above, provides a female banana jack socket. The male resilient banana jack 118 and female banana jack socket provided by the bore 105 provide the same advantages with regard to angular misalignment during blind assembly, namely, reduced insertion and withdrawal forces and consistent electrical area contact, as does the male resilient banana jack 62 and female banana jack socket 54 included in the first semiconductor wafer chuck embodiment shown in FIG. 2 and described above. The bottom male resilient banana jack 120, FIG. 3, may be received in a female banana jack socket 122 provided in an electrical connector 123 for mechanical and electrical engagement therewith. The electrical connector 123 is connected to suitable sources of RF biasing power 30 and DC chucking voltage 32 by electrical conductor 35.

Referring further to FIG. 3, the cooling plate 80 is provided with a stepped bore 130 formed therein and extending therethrough. The resilient insulator 83 tightly engages the second connector element 76b comprising the first connector member 76 and a portion of the first connector element 110b comprising the second connector member 78 and eliminates air gaps between the cooling plate 80 and the connector elements 76b and 110b; the second connector element 76b may be provided with an inwardly extending generally annular indentation 108 (note particularly FIG. 3E) and the insulator 83 may be provided with an outwardly extending generally annular ridge or projection 111 (FIG. 3) for being received within the indentation 102 to enhance or further secure the tight engagement between the insulator 83 and the second connector element 76b. Similarly, the resilient insulator 84 surrounds and tightly engages the pliable conductive wrap 116 and portions of the first connector element 110b and second connector element 110a to substantially eliminate air gaps between such elements and the cooling plate 80. Removal of such air gap substantially eliminates RF arcing which RF arcing can produce metal deposition with attendant ruinous RF shorting.

While the semiconductor wafer chuck 70 of FIG. 3, including the connector 74, is generally useful, it is particularly useful as a high temperature semiconductor wafer chuck and connector. As is known, some semiconductor wafer processing requires that the semiconductor wafer chuck be operated at from about 200° C. to about 500° C., for example, or about 350°. Were the chuck body 72 of the chuck 70, FIG. 3, to be heated to a temperature of about 350° C., and were such heat of the chuck body to be substantially transferred or conducted by the connector 74 to the male resilient banana jack 120 provided at the bottom or distal end of the second connector member 78, generally non-commercially available, and typically very expensive, high temperature electrical connector 123 and electrical conductor 35 would be required to connect the resilient banana jack 120 to the sources of RF biasing power 30 and DC chucking voltage 32. In the preferred embodiment, the second connector element 76b of connector member 76 and the connector elements 110a and 110b and solid central core 112 (FIG. 3F) of the second connector member 78, as noted above, are made of stainless steel so as to provide a thermal impedance for reducing the heat transferred from the chuck body 72 and the first connector element 76a to the bottom male resilient banana jack 120. As set forth in REFERENCE DATA FOR RADIO ENGINEERS, Fourth Edition, Copyright 1943, 1946 and 1949, Federal Telephone and Radio Corp., page 45, drawn molybdenum has a coefficient of thermal conductivity of 1.46 and stainless steel [18-18 stainless (0.1C, 18CR, 8Mi balance Fe)] has a coefficient of thermal conductivity of 0.163 or approximately 11% of the coefficient of thermal conductivity of the molybdenum. Accordingly, the stainless steel second connector element 76b and the stainless steel components of the second connector member 78 provide thermal impedance at least assisting in reducing the temperature of the heat of the chuck body 72 and first molybdenum connector element 76a transferred to the resilient banana jack 120 provided at the bottom of the second connector member 78.

Upon the semiconductor wafer chuck 70 and the connector 74 being high temperature chucks and connectors, the resilient silicone insulators 83 and 84, FIG. 3, in the preferred embodiment are made of a suitable high temperature silicone including a thermally conductive filler; such high temperature silicone may be, for example the DOW CORNING 23035-T RED high temperature silicone available from Dow Corning Corporation of Midland, Mich. As noted in FIG. 3, and described above, the high temperature resilient insulator 83 surrounds and engages the first connector element 76b, surrounds and engages an upper portion of the second connector member 78 and also engages the cooling plate 80; the high temperature resilient insulator 84 surrounds and engages the generally central portion of the second connector member 78 and the cooling plate 80. Accordingly, it will be understood that such high temperature resilient insulators are sufficiently non-electrically conductive to electrically insulate the second connector element 76b and the upper portion of the second connector member 78 from the cooling plate and that such insulators are sufficiently thermally conductive to transfer heat from the second connector element 76b and the upper and generally central portion of the second connector member 78 to the cooling plate 80. Upon the semiconductor wafer chuck 70 being operated, for example, at the elevated temperature of 350° C. as noted above, the high temperature resilient insulators will transfer sufficient heat from the second connector element 76b and the second connector member 78, coupled with thermal impedance provided by the second connector element 76b, to reduce the temperature at the male resilient banana jack 120 provided at the bottom of the second connector member 78 to approximately 50° C. whereby the electrical connector 123 and electrical conductor 35 may be commercially available and relatively inexpensive components.

Referring again to FIG. 3, in an alternate embodiment of the present invention, the first and second electrically conductive connector elements 110a and 110b are beryllium copper and for RF current conduction are coated with successive layers of nickel, copper, nickel and gold. Otherwise, this alternate embodiment includes the same structural elements shown in FIG. 3 and functions in substantially the same manner as described above in connection with the earlier invention embodiment described in connection with FIG. 3.

Figure 4:
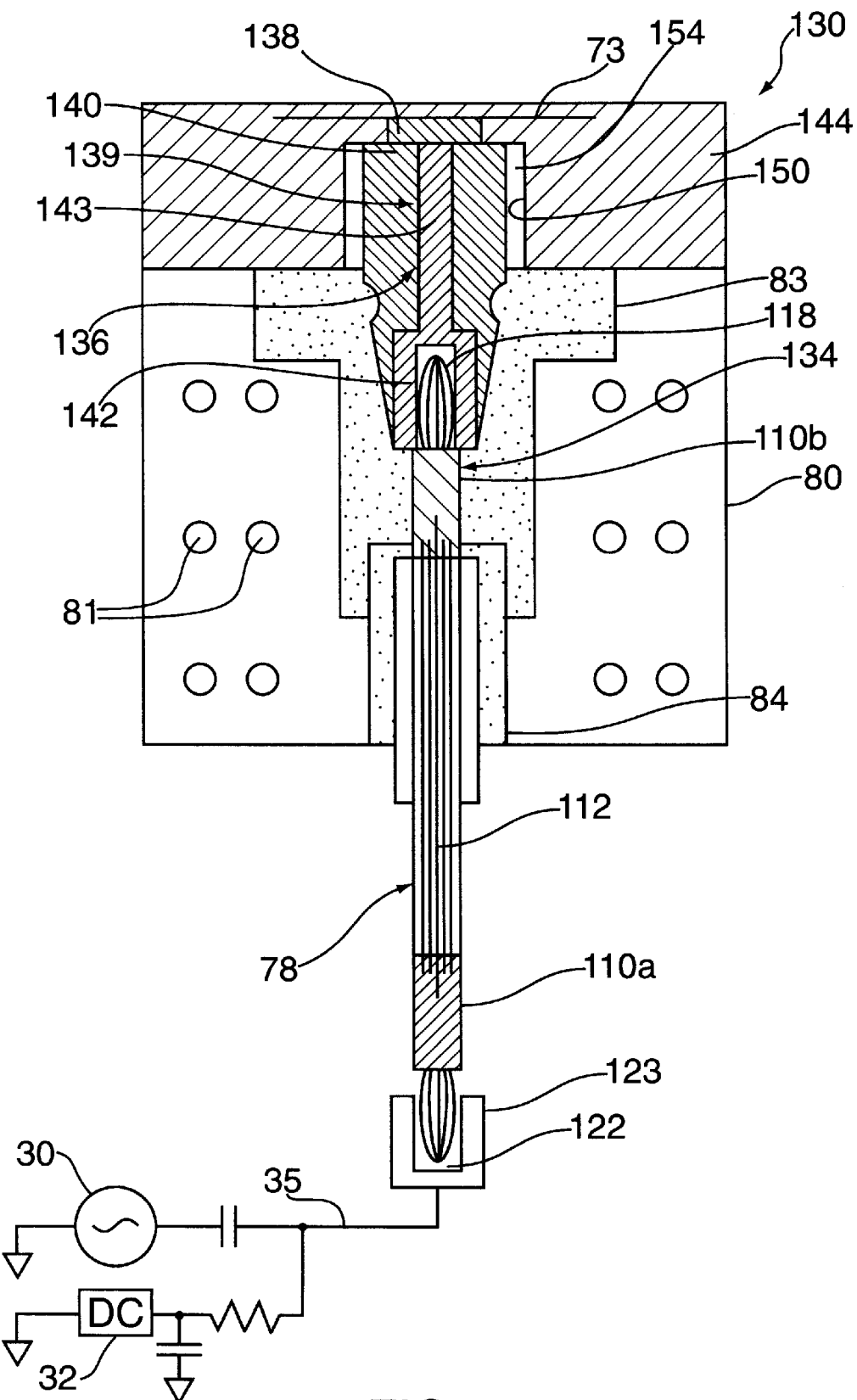
FIG. 4 is a vertical elevational view, generally in cross-section, of a still further embodiment of a semiconductor wafer chuck and connector of the present invention.
Figure 4A:
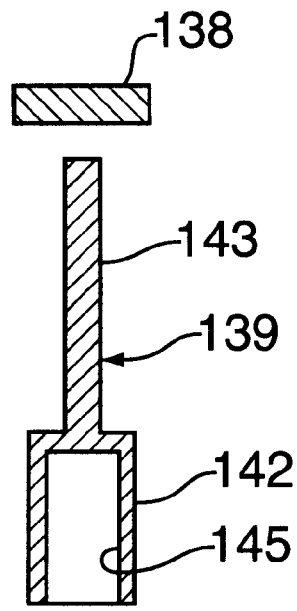
FIG. 4A is a separate view of the connector elements shown in FIG. 4.

The semiconductor wafer chuck 130 in FIG. 4 also embodies the present invention and is a further alternate embodiment. The semiconductor wafer chuck 130 includes many of the structural elements comprising the semiconductor wafer chuck 70 shown in FIG. 3 and described above, and for convenience of reference the elements comprising the chuck 130 which are the same as those comprising the chuck 70 have been given the same numerical designations and will be understood to perform the same functions. Accordingly, only the elements comprising the chuck 130 which are different from those comprising the chuck 70 will be described in detail. The connector 134 connects RF biasing power and DC chucking voltage to the chuck electrode 73 and in this connector invention embodiment the connector 134 includes an first connector member 136 and the second connector member 78 shown in FIG. 3 and described above. The first connector member 136 includes a first connector element 138 and a second connector element 139. First connector element 138 may be mechanically and electrically connected to the embedded electrode 73 by brazing and may be made of molybdenum and may be suitably plated with a suitable plating material chosen from a group consisting of gold, silver, nickel and copper for RF current conduction. The second connector element 139, better seen in FIG. 4A, includes a top, a bottom hollow cylindrical member 142, and a solid cylindrical intermediate member 143 extending upwardly therefrom and having a diameter smaller than the diameter of the lower cylindrical member 142. The second connector element 139 may be made of stainless steel to provide thermal impedance in the same manner as the second connector element 76b shown in FIG. 3E and described above, and the bottom hollow cylindrical member 142 is provided with an upwardly extending blind bore 145 (FIG. 4a) which provides a female banana jack socket for receiving the male resilient banana jack 118, and the bore 145 is considered to be a complementary resilient banana connector.

Figure 4B:
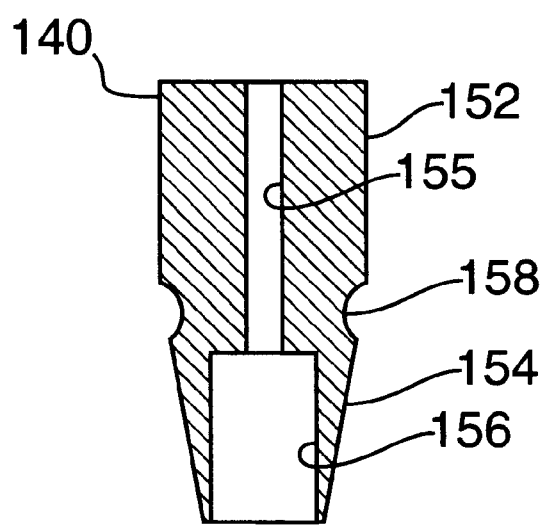
FIG. 4B is a separate view of a connector element shown in FIG. 4.

The semiconductor wafer chuck 130 includes a thermally isolating member 140, better seen in FIG. 4B, includes an upper annular or cylindrical portion 152, an integrally formed lower generally trapezoidal portion 154, tapering inwardly downwardly, and has a longitudinal bore 155 extending therethrough for receiving the solid cylindrical portion 143 of the second connector element 139, and the trapezoidal portion 154 has an upwardly extending bore 156 formed therein (FIG. 4B) for receiving the hollow cylindrical portion 142 of the second connector element 139. The thermally isolating member 140 is made of a suitable low thermally conductive ceramic, such as for example alumina, and is for electrically isolating at least the solid cylindrical member 143 of the second connector element 139 from the cooling plate 80 and the thermally isolating member 140 may be provided with an inwardly extending groove 158 whose purpose is the same as the inwardly extending groove 108 provided in the second connector element 76b shown in FIG. 3E and described above.

The chuck body 144 of this embodiment, FIG. 4, is provided with a generally centrally formed stepped bore 150 extending upwardly from the bottom of the chuck body towards the top of the chuck body and opening to the embedded electrode 73. The stepped bore 150 includes two upwardly extending cylindrical portions decreasing in diameter successively upwardly and from FIG. 4 it will be noted that the first connector element 138 resides in the upper cylindrical portion of the bore 150 and that the upper annular or hollow cylindrical portion 152 of the thermally isolating member 140 resides in the lower cylindrical portion of the stepped bore 150 and is bonded to the ceramic chuck body 72 by an annular body of suitable high temperature adhesive material 154 for bonding ceramics together. Such bonding provides the connector 134, particularly the second connector element 139 with improved robustness, RF arc suppression between the second connector element 139 and the chuck body and in particular increases the amount of force required to break or impair the mechanical, and thereby the electrical, interconnection between the upper first connector element 138 and the embedded electrode 73 which force can be experienced upon any misalignment forces being created in the blind assembly of the first connector member 134 with the second connector member 78.

Referring again to FIG. 4, in an alternate embodiment to the embodiment illustrated in FIG. 4, the first and second electrically conductive connector elements 110*a* and 110*b* are beryllium copper and for RF current conduction are coated with successive layers of nickel, copper, nickel and gold. Otherwise, in this alternate embodiment, the structural elements shown in FIG. 4 are the same and this alternate embodiment functions substantially the same as described above with regard to the earlier embodiment described in connection with FIG. 4.

Figure 5:
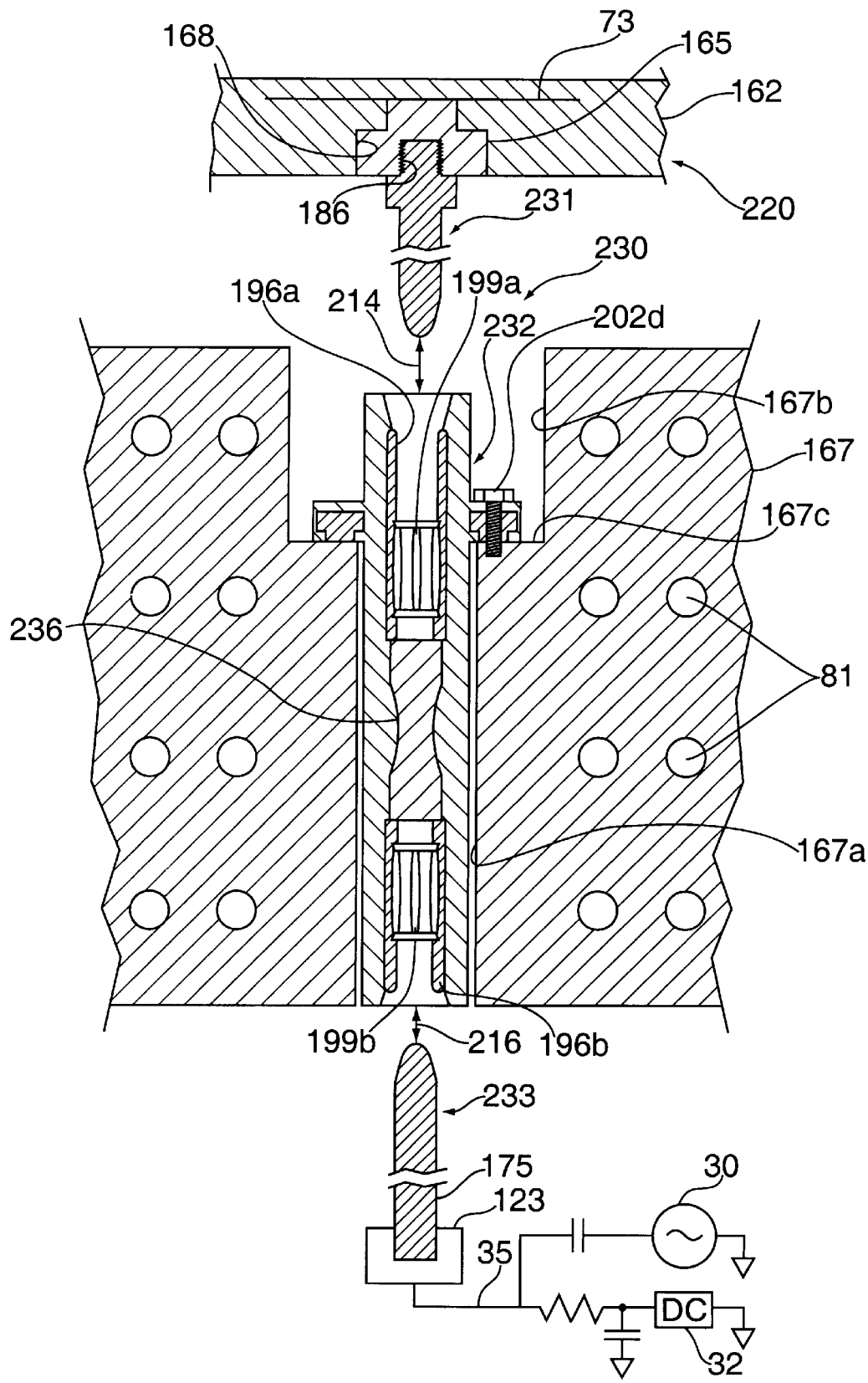
FIG. 5 is an exploded vertical elevational view, in cross-section, of a further embodiment of a semiconductor wafer chuck and connector of the present invention.

Referring now to FIG. 5, the semiconductor wafer chuck 220 embodies the present invention and is a still further embodiment thereof. The semiconductor wafer chuck 220 includes a chuck body 162, an electrode 73 embedded in the chuck body, an electrode connector 165, a cooling plate 167 which may be of the same general type shown in FIGS. 3–4 and described above, and a connector 230 also embodying the present invention. The chuck body 162 may be aluminum nitride, the electrode 73 may be a molybdenum mesh electrode, the cooling plate 167 may be aluminum, the electrode connector 165 may be a molybdenum electrode connector plated with an electrically conductive material for conducting RF biasing power to the embedded electrode 73, the plating material may be chosen from the group consisting of silver, gold, nickel and copper; alternatively the RF current conduction plating material may be successive layers of nickel, copper, nickel and gold. The connector electrode connector 165 is mechanically and electrically connected to the electrode 73 such as by brazing. The electrode connector 165 resides in a centrally formed stepped generally cylindrical bore 168 extending upwardly into the chuck body 162 and opening to the electrode 73. The connector 230 includes a first connector member 231 (better seen in FIG. 6), a second connector member 232 (better seen in FIG. 7), and a third connector member 233 (better seen in FIG. 8). Generally, FIG. 5, the connector member 231 is inserted into the top of the connector member 232 in blind assembly of the chuck body 162 to the cooling plate 167 and the connector member 233 is for being inserted into the bottom of the connector member 232 to connect RF biasing power from the source 30 and DC chucking voltage from the source 32 to the embedded electrode 73 through the connector 230. The cooling plate 167 is provided with a centrally formed generally cylindrical bore 167*a* whose top portion is provided with a counter bore 167*b* which permits an annular mounting surface 167*c* for mounting the connector 230 in the manner described in detail below.

Figure 6:
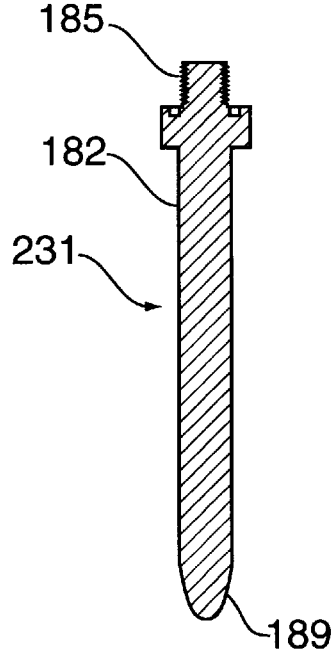
FIGS. 6–8 are detailed elevational cross-sectional views of connector members which upon being interconnected comprise the connector shown in exploded view in FIG. 5.

Referring now to the detailed structure of the connector members, and in particular to FIG. 6, connector member 231 is a solid, generally cylindrical connector member which in the preferred embodiment is stainless steel and which is provided at its top with an integrally formed and upwardly extending and externally threaded projection 185 for threadedly engaging the internal threads provided in the bore 186 (FIG. 5) extending upwardly into the electrode connector 165 to mechanically and electrically interconnect the connector member 231 to the electrode connector 165 and thereby to the embedded electrode 73. The bottom or distal end 189 of the connector member 182, as shown in FIG. 6, is a generally conical or tapered male connector or male connector member and will be understood to be a complimentary resilient banana connector which is for being received in a female resilient banana connector. The connector member 231 is plated with suitable electrically conductive material for RF current conduction and may be chosen from a group consisting of silver, gold, nickel and copper; in the preferred embodiment, the plating is silver. Alternatively, the electrically conductive material for RF current conduction may be successive layers of nickel, copper, nickel and gold.

Figure 7:
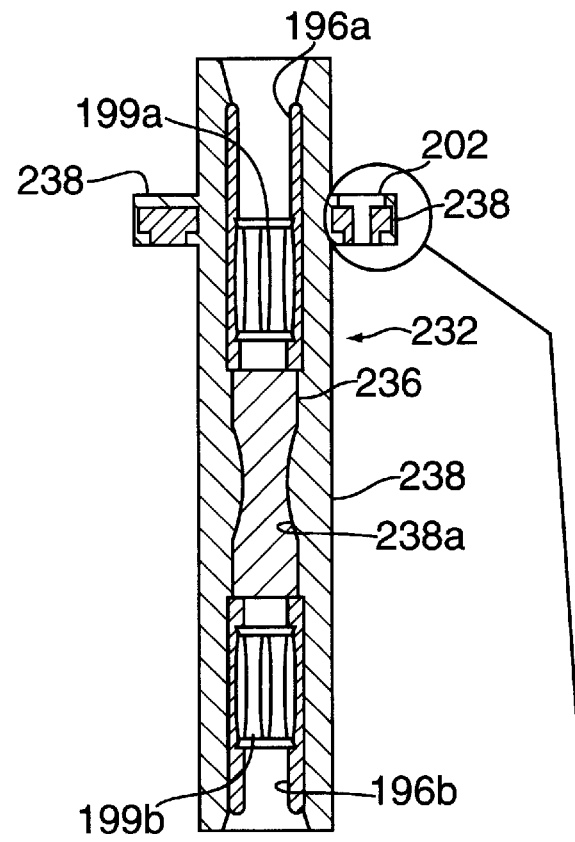

Referring now to FIG. 7 and to the detailed structure of the connector member 232, the connector member 232 includes an inner or first connector element 236 and an outer or second connector element 238. The first connector element 236 includes a solid generally cylindrical central portion and is provided at its opposed or top and bottom ends with integrally formed generally hollow or annular cylindrical portions 196*a* and 196*b* in which are respectively mounted resilient banana connectors, namely, suitable female resilient banana connectors 199*a* and 199*b*; the female resilient banana connectors 199*a* and 199*b* may be suitably pressed-fitted into the hollow cylindrical portions 196*a* and 196*b* to place the banana connectors and hollow cylindrical portions in mechanical and electrical engagement with the connector element 236. The first connector element 236 and the female resilient banana connectors 199*a* and 199*b*, in the preferred embodiment are beryllium copper, and may be plated with an electrically conductive material to enhance RF current conduction and which material may be chosen from a group consisting of silver, gold and nickel; alternatively the RF current conduction plating material may be successive layers of nickel, copper, nickel and gold. The second connector element 238 is a generally hollow cylindrical electrically insulative connector element and is an isolator for electrically insulating or isolating the connector element 236 from the cooling plate 167 (FIG. 5) and for eliminating air gaps and RF arcing therebetween. In the preferred embodiment, the second connector element 238 is a resilient connector element and is provided with an internal generally cylindrical bore 238*a* for tightly receiving the first connector element 236. The second connector element 238 in a preferred embodiment is a body of high temperature silicone including a thermally conductive additive of the type described above with regard to resilient silicone insulators 83 and 84 as shown in FIG. 3. The second silicone conductor element 238, in the preferred embodiment, is molded in place around the first conductor element 236 so as to be in intimate contact with the outer surface of the inner connector element 236 and such intimate contact prevents RF arcing between the first inner connector element 236 and the second outer connector element 238. From FIGS. 5 and 7 it will be noted that the central portion of the conductor element 236 is indented to provide the central portion with a generally hourglass shape so as to enhance the molding of the second silicone conductor element 238 around the conductor element 236 and to enhance the engagement therebetween.

Figure 8:
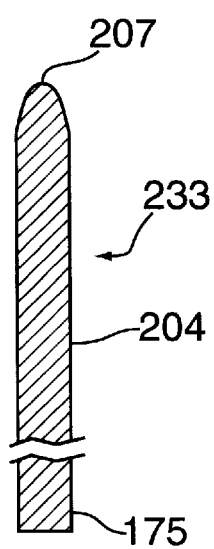

The detailed structure of connector member 233 is shown in FIG. 8. The connector member 233 is a solid generally cylindrical connector element which is provided at its upper end with a generally tapered or conical male connector or male connector member 207 which is a complementary resilient banana connector and is for being received within the female resilient banana connector 199*b* provided at the bottom of the connector element 236 (FIG. 7); in the preferred embodiment the connector member 233 is copper or beryllium copper, and to enhance RF current conduction the connector member 233 may be plated with electrically conductive material chosen from a group consisting of silver, gold and nickel; alternatively the RF current conduction plating material may be successive layers of nickel, copper, nickel and gold.

Figure 7A:
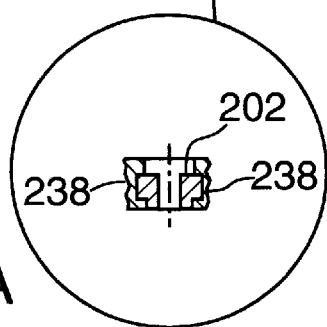
FIG. 7A is a separate view of the encircled portions of FIG. 7.
Figure 9:
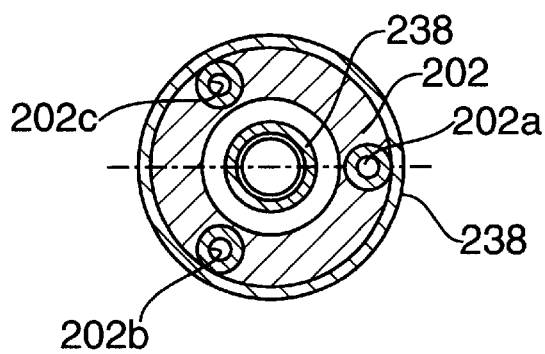
FIG. 9 is a top view of FIG. 7.

Referring to FIGS. 7, 7A and 9, it will be further understood that the connector member 232 includes a thermally conductive ring 202, which in the preferred embodiment is a copper ring, and which thermally conductive ring 202 is surrounded or embedded in a portion of the silicone second connector element 238. Thermally conductive ring 202, FIG. 9, is provided with a plurality of holes or bores 202a, 202b, 202c for having threaded bolts extended therethrough, such as representative threaded bolt 202d, shown in FIG. 5, and is for mechanically mounting the connector member 232 to the cooling plate 167 (FIG. 5); more particularly as shown in FIG. 5 the thermally conductive ring 202 and thereby the connector member 231 are mounted to the annular mounting surface 167c by threading bolts, e.g., representative threaded bolt 202d, which threadedly engage corresponding threaded bores extending inwardly into the mounting surface 167c. It will be understood that the metal ring 202, through the bolts residing in bores 202a–202d, mount the connector member 232 mechanically securely to the cooling plate 167 but, since the metal ring 202 is surrounded by or embedded in a portion of the outer resilient silicone connector element 238, the resilient silicone connector element 238 is sufficiently deformable or resilient to permit sufficient relative movement between the connector member 232 and the cooling plate 167 to facilitate insertion of the male connector member 189 provided at the end of the connector member 231 (FIG. 6) into the female resilient banana connector 199a provided at the top of the connector element 236 in blind assembly of the chuck body 162 and connector member 231 with the connector member 232 and cooling plate 167. Such deformability or flexibility of the silicone connector element 238 also facilitates withdrawal of the connector member 231 from the connector member 232, FIG. 5, and disassembly of the chuck body 162 and connector member 231 from the connector member 232 and cooling plate 167. Such assembly and disassembly is as indicated by the double headed arrow 214 in FIG. 5. Similarly, the resilient silicone second connector element 238 permits at least some movement of the female resilient banana connector 199b within the bottom portion of the connector member 232 to facilitate insertion and withdrawal of the male metal connector member 207 provided at the top of the connector member 233 for the connection and disconnection (FIG.5) of the RF source 30 and the DC source 32 through the connector 230 to and from the embedded electrode 73 provided in the chuck body 162. The insertion and withdrawal, assembly and disassembly, of the female resilient banana connector 199b and male connector member 207 is indicated by the double headed arrow 216 at the lower portion of FIG. 5.

Figures 1, 1A:
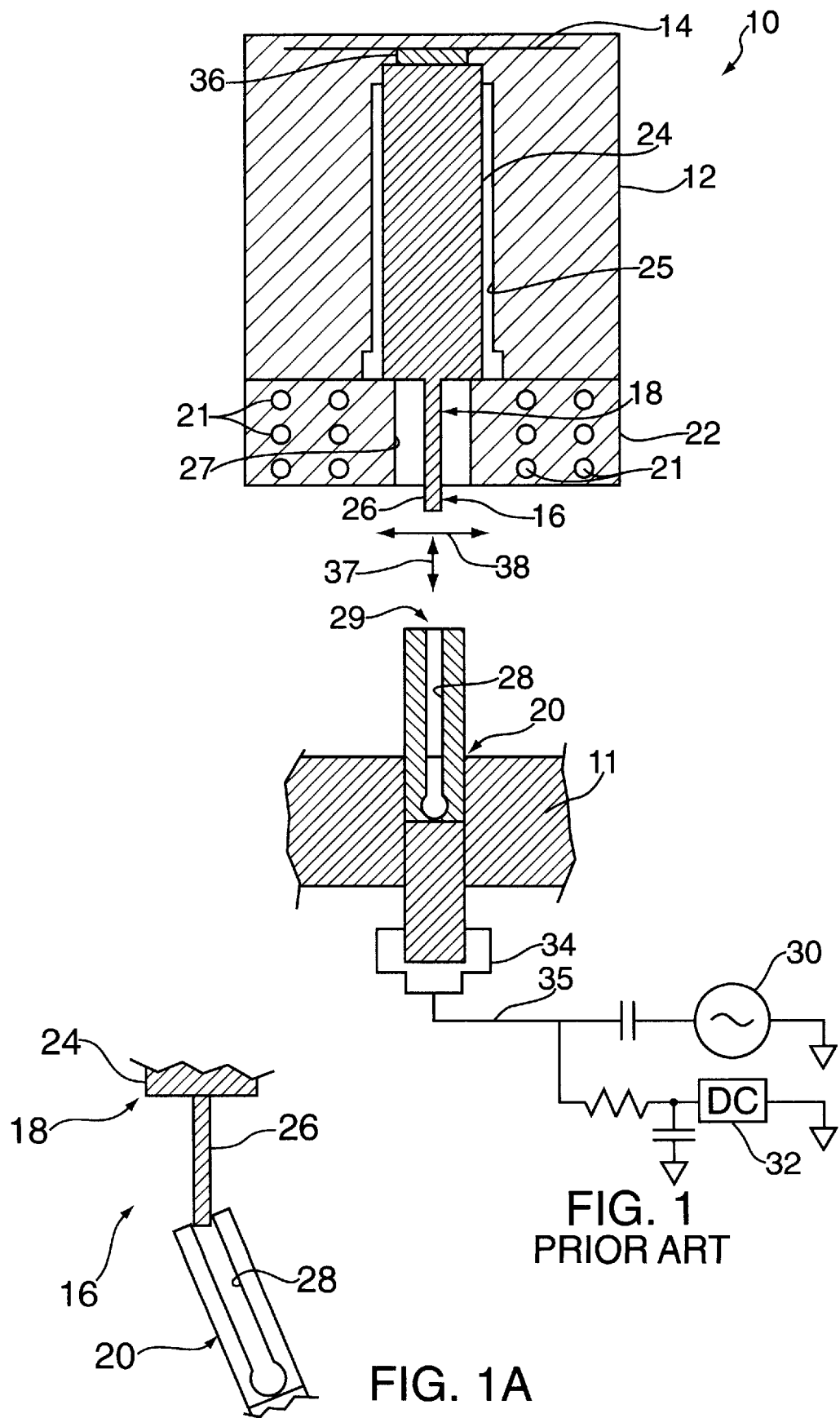
FIG. 1 is a vertical elevational view, generally in cross-section, of a prior art semiconductor wafer chuck and connector.
FIG. 1A is a partial diagrammatical view illustrating pin and collet angular misalignment during blind assembly of the connector members.

The insertion of the male connector members 189 and 207 provided respectively on the connector members 231 and 233 into the female resilient banana connectors 199a and 199b provided at the top and bottom of the connector member 232 mechanically and electrically interconnect such connector members and it will be further understood that the female resilient banana connectors 199a and 199b accommodate any angular misalignment between the connector members 231, 232 and 233, particularly in blind assembly, and that the resilient female banana connectors 199a and 199b provide substantially consistent mechanical and electrical area or surface contact with the male connector members 189 and 207 and provide lower insertion and withdrawal. forces therebetween as compared to the pin and collet connector member interconnections illustrated in FIG. 1 and described above.

While the semiconductor wafer chuck 220 and connector 230 of FIG. 5 are generally useful, they are particularly useful as a high temperature semiconductor wafer chuck and conductor. As noted above, in some semiconductor wafer processing, the semiconductor wafer chuck 220 is operated at an elevated temperature, namely, about 200° C. to about 500° C., and for example at about 350° C. Were the chuck body 162 of the chuck 220, FIG. 5, to be heated to a temperature of about 350° C., for example, and were the heat of the chuck body 162 to be substantially transferred or conducted by the connector 230 to the bottom or distal end 175 of the connector member 233 shown in FIG. 5, generally noncommercially available, and typically very expensive, high temperature electrical connector 123 and conductor 35 would be required to connect the bottom connector member 233 to the sources of RF biasing power 30 and DC chucking voltage 32. In the preferred embodiment, connector member 231 (FIG. 6), as noted above, is made of stainless steel so as to provide thermal impedance for reducing the heat transferred from the chuck body 162 to the male connector member 189 provided at the bottom of the connector member 233, FIG. 5.

As noted above, stainless steel [18-18 stainless (0.1C, 18CR, 8Mi balance Fe)] has a coefficient of thermal conductivity of 0.163 or approximately 11% of the coefficient of thermal conductivity of the electrode connector 165 which, as noted above, is made of molybdenum in the preferred embodiment. It will be further understood in accordance with the teachings of the present invention that upon the semiconductor wafer chuck 220 being operated, for example, at about 350° C., and upon the connector 230 being a high temperature conductor, the resilient silicone connector element 238 of the connector member 232 (FIG. 7) will be made of the same high temperature silicone with a thermally conductive additive as the resilient silicone insulators 83 and 84 shown in FIG. 3 and described above. Thus, it will be understood that the resilient high temperature silicone second connector element 238 serves two functions; first, it is sufficiently electrically non-conductive that it electrically isolates the inner or first copper connector element 236 of the connector member 232, FIG. 5, from the cooling plate 167, and, secondly, it is sufficiently thermally conductive that it transfers heat from the inner or first copper connector element 236 to the cooling plate 167. Accordingly, it has been found that upon the connector member 231 being stainless steel and providing thermal impedance as described above, that upon the silicone connector element 238 being a high temperature thermally conductive silicone, and that upon the cooling plate 167 being operated in the manner known to the art to control the heat transferred away by the cooling plate 167, such thermal impedance of the connector member 232 and the thermal conductivity of the high temperature silicone connector element 238 reduce or drop the temperature of the heat transferred to the copper connector member 233 by about 300° C. whereby upon the high temperature chuck 160 being operated at about 350° C., the temperature at the distal end 175 of the copper connector member 233 is about 50° C. which permits the electrical connector 123 and the electrical conductor 35 to be a commercially available connector and conductor thereby greatly reducing their expense. Referring again to the invention embodiment seen in FIGS. 5 and 7, and, in particular to FIG. 5, it will be understood that this invention embodiment includes an asymmetrical feature which provides enhanced heat transfer from the connector member 232 to the cooling plate 167. It will be noted that the thermally conductive ring 238 (FIG. 7) is not located midway between the top and bottom of the connector member 232, but, instead is located proximate the top of the connector member 232 and hence the connector member 232 will be understood to be asymmetrical. Similarly, from FIG. 5, it will be noted that the annular mounting surface 167c is not located midway between the top and bottom of the cooling plate 167 but, instead, is located proximate the top of the cooling plate and hence the mounting surface 167c and of the cooling plate 167 will be understood to be asymmetrical. This asymmetry causes the majority of the vertical extent of the connector elements 236 and 238 comprising the connector member 232 to be opposite and proximate the majority of the vertical extent of the cooling plate 167 as shown in FIG. 5. Accordingly, it will be understood that this asymmetry enhances the transfer of heat from the inner connector element 236 and the outer connector element 238 of the connector number 232 to the cooling plate 167 and hence more heat is transferred from these connector elements to the cooling plate than would be transferred were the thermally conductive ring 238 and the annular mounting surface 167c to be located midway between the top and bottoms of their respective structures.

Figure 10:
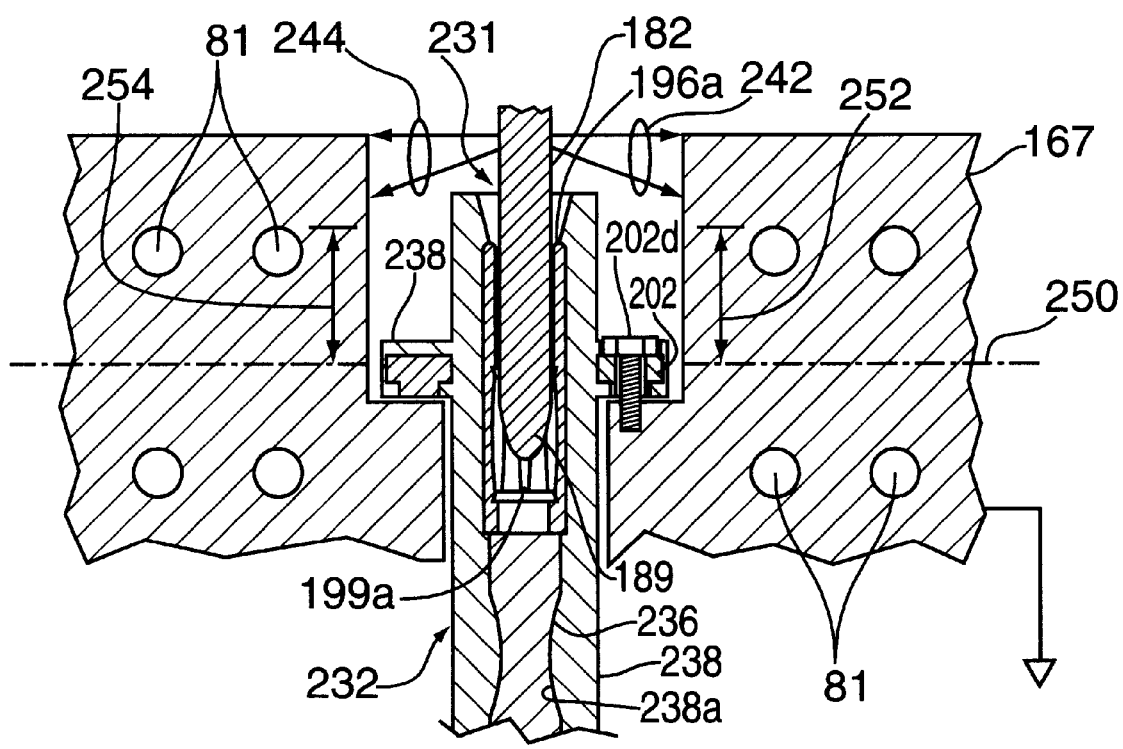
FIG. 10 is a partial view diagrammatical illustration of two engaged connector members comprising a connector of the present invention.

The advantages provided by the connector 230 of the present invention will be further appreciated by reference to FIG. 10. FIG. 10 illustrates the connector member 231 inserted into the connector member 232, and more particularly, illustrates the lower portion of the connector member 231, particularly the conical or tapered male connector member 189, inserted into and placed into mechanical and electrical engagement with the female resilient banana connector 199a. In one embodiment, the connector member 231 had an outer diameter of 0.198 inch and the annular cylindrical upper portion 196a, formed integrally with the connector element 23E had an inner diameter of 0.235 inch. Accordingly, as will be understood from FIG. 10, upon the connector member 231 being inserted into the upper annular portion 196a of the connector element 236, an annular air gap will exist between the lower portion of the connector member 231 and the annular cylindrical portion 196a of the connector element 236. However, it will be understood, that since as described above, the connector element 236 including the integrally formed upper hollow cylindrical portion 196a, the resilient female banana connector 199a and the connector member 231 are made of electrically conductive material, and since they are electrically interconnected as described above upon the connector member engagement shown in FIG. 10, the connector member 231, the resilient flexible female banana connector 199a and the upper hollow cylindrical portion 196a of the connector element 236 will be at the same electrical potential upon the connector 230 (FIG. 5) connecting DC chucking voltage and RF power to the chuck electrode 73, and hence RF arcing between the connector member 231 in the upper annular portion 196a of the connector element 236 will be substantially eliminated.

It will be further understood from FIG. 10, that the difference between the outer diameter of the connector member 231 and the inner diameter of the upper hollow cylindrical portion 196a of the connector element 238 will further facilitate blind assembly of the chuck body 162 (FIG. 5) and the connector member 231 with the connector member 232.

A still further advantage of the present invention will be appreciated from FIG. 10 and from the bundles of arrows 242 and 244 which indicate diagrammatically the electrical fields which will be present between the connector member 231 and the grounded cooling plate 167 upon the connector 230 (FIG. 5) connecting DC chucking voltage and RF current or power to the chuck electrode 73. Since the cooling plate 167 typically is grounded, what is sometimes referred to in the art as a ground plane will be present as indicated diagrammatically by a representative ground plane indicated by the dashed horizontal line 250 between the thermally conductive copper ring 202 and the grounded cooling plate 167. However, again due to the upper extending, generally hollow annular cylindrical portion 196a of the connector element 238 the electrical fields indicated by the arrows 242 and 244 will only exist in air above the outer upper end of the hollow cylindrical connector element portion 196a and hence the vertical distance between such electric fields and the ground plane 250, indicated by the vertical arrows 252 and 254 in FIG. 10, will be so great that such electric fields will be so weak that arcing between the upper portion of the connector member 231 above the hollow cylindrical connector element portion 196a and the grounded cooling plate 167 will be so weak that RF arcing between the connector member 231 and the grounded cooling plate 167 will be substantially eliminated.

It will be understood that while the present invention has been shown and described in the context of semi-conductor wafer chucks including a single embedded electrode, the present invention is not so limited and is equally applicable to semiconductor wafer chucks including more than one embedded electrode.

Although various embodiments which incorporate the teachings of the present invention have been shown and described in detail herein, those skilled in the art can readily devise many other varied embodiments that still incorporate these teachings.

What is claimed is:

1. Semiconductor wafer chuck apparatus, comprising:
    a chuck body having at least one electrode embedded therein;
    a cooling plate positioned proximate said chuck body having a bore;
    a first connector element connected to said at least one electrode and extending from said chuck body into said bore in said cooling plate;
    a second connector element removably attachable to said first connector element; and
    a resilient support element that conformally circumscribes the second connector element and is affixed to said cooling plate to support said second connector element within said bore in said cooling plate.

2. The semiconductor wafer chuck apparatus of claim 1 wherein said first connector element comprises a pin.

3. The semiconductor wafer chuck apparatus of claim 1 wherein said first connective element interfits a first end of said second connector element and a second end of said second connector element interfits a third connector element.

4. The semiconductor wafer chuck apparatus of claim 1 wherein said third connector element is coupled to a power supply.

5. The semiconductor wafer chuck apparatus of claim 1 wherein said second connector element further comprises:
    an elongated, substantially cylindrical portion having at least one hollow cylindrical end; and
    a resilient connector portion residing within said at least one hollow cylindrical end.

6. The semiconductor wafer chuck apparatus of claim 5 wherein said elongated, substantially cylindrical portion and the resilient connector portion are coated with a material to promote radio frequency signal propagation.

7. The semiconductor wafer chuck apparatus of claim 5 wherein the resilient connector portion is a female banana connector.

8. The semiconductor wafer chuck apparatus of claim 5 wherein said elongated, substantially cylindrical portion has an hourglass shape.

9. The semiconductor wafer chuck apparatus of claim 5 wherein the at least one hollow cylindrical end extends past said resilient connector portion.

10. The semiconductor wafer chuck apparatus of claim 5 wherein the resilient support element further comprises:
    a substantially cylindrical portion having an inner bore that conformally interfits with the elongated, substantially cylindrical portion; and
    a flange that extends radially from the substantially cylindrical portion of the resilient support member.

11. The semiconductor wafer chuck apparatus of claim 10 wherein the flange further comprises a thermally conductive ring.

12. The semiconductor wafer chuck apparatus of claim 1 wherein the resilient support portion is fabricated of silicone.

13. A connector apparatus for a semiconductor wafer chuck apparatus comprising:
    an elongated, substantially cylindrical portion having at least one hollow cylindrical end;
    a resilient connector portion residing within said at least one hollow cylindrical end; and
    a substantially cylindrical insulative portion having an inner bore that conformally interfits with the elongated, substantially cylindrical portion.

14. The connector apparatus of claim 13 wherein said elongated, substantially cylindrical portion and the resilient connector portion are coated with a material to promote radio frequency signal propagation.

15. The connector apparatus of claim 13 wherein the resilient connector portion is a female banana connector.

16. The connector apparatus of claim 13 wherein said elongated, substantially cylindrical portion has an hourglass shape.

17. The connector apparatus of claim 13 wherein the at least one hollow cylindrical end extends past said resilient connector portion.

18. The connector apparatus of claim 13 further comprising:
    a flange that extends radially from the substantially cylindrical insulative portion.

19. The connector apparatus of claim 18 wherein the flange further comprises a thermally conductive ring.

20. The connector apparatus of claim 13 wherein the substantially cylindrical insulative portion is fabricated of silicone.

* * * * *